Aug. 11, 1964 J. S. THORP 3,144,622

VOLTAGE VARIABLE OSCILLATOR

Filed May 7, 1962 4 Sheets-Sheet 1

INVENTOR,
JAMES S. THORP

BY Jack H. Linscott

ATTORNEY

VOLTAGE VARIABLE OSCILLATOR
Filed May 7, 1962 4 Sheets-Sheet 2
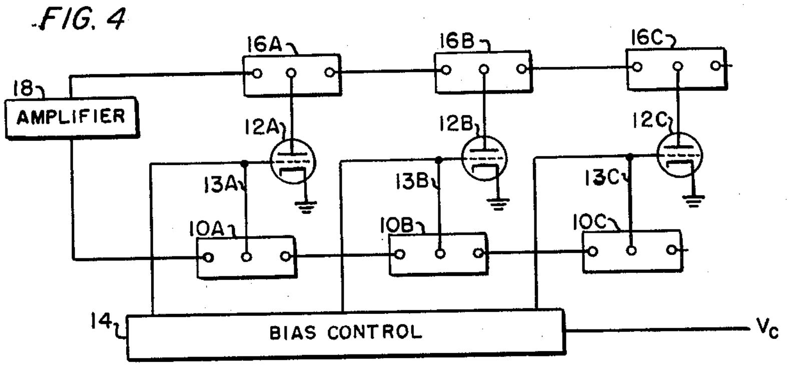
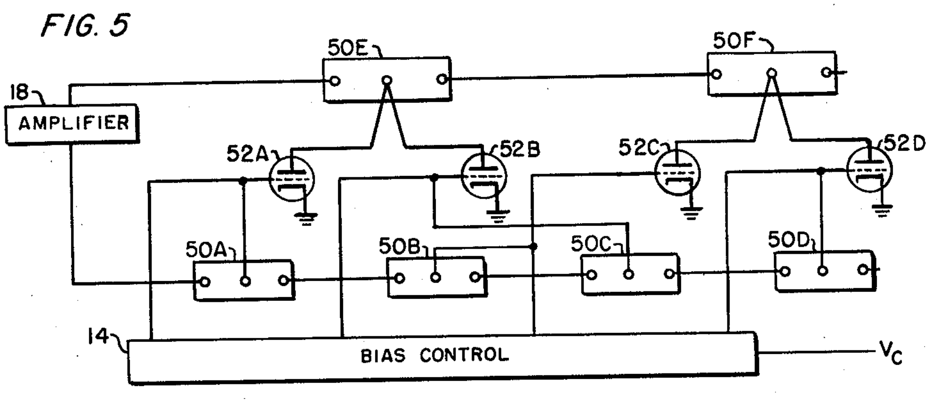
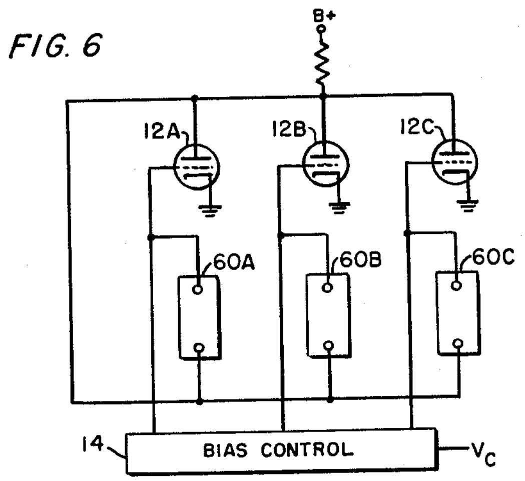
INVENTOR,
JAMES S. THORP
BY Jack H. Linscott
ATTORNEY.

INVENTOR,
JAMES S. THORP
BY Jack H. Linscott
ATTORNEY

VOLTAGE VARIABLE OSCILLATOR

Filed May 7, 1962 4 Sheets-Sheet 4

INVENTOR,
JAMES S. THORP.
BY Jack H. Linscott
ATTORNEY.

United States Patent Office 3,144,622

Patented Aug. 11, 1964

3,144,622

VOLTAGE VARIABLE OSCILLATOR

James S. Thorp, Ithaca, N.Y., assignor to the United States of America as represented by the Secretary of the Army Filed May 7, 1962, Ser. No. 193,029
9 Claims. (Cl. 331—135)

This invention relates to oscillators and particularly to variable frequency oscillators. More particularly, this invention relates to variable frequency oscillators controlled by delay lines.

Oscillators are well known and most of the practical types of oscillators are variable. In the variable oscillators using delay lines as the means of establishing a time factor, the frequency is usually changed by switching in various increments of delay or by using certain types of delay lines that can be varied by means of a mechanical control. In the oscillators that are variable by electrical control the variable control element is usually a variable capacity diode, and the oscillator is limited in the range of frequencies over which the relatively small available capacities are effective and in the band width of tuning that is possible.

It is therefore an object of this invention to provide an improved oscillator.

It is a further object of this invention to provide an improved oscillator having its frequency determined by a variable delay line.

It is a further object of this invention to provide an improved delay line oscillator with continuously variable delay.

It is a further object of this invention to provide an improved, electrically variable oscillator.

It is a further object of this invention to provide an improved, electronically-variable oscillator having continuously variable control over a relatively wide band of frequencies in a relatively low frequency range.

These and other objects are accomplished by connecting several delay lines in series and connecting several variable gain amplifiers between the input to the delay lines and various points at intervals along the delay lines. An electrical control is provided to gradually increase and decrease the gain of the amplifiers successively to gradually increase the effective amount of delay from the input through the delay lines and back to the input.

This invention will be better understood and other and further objects of this invention will become apparent from the following specification and the drawings of which FIGURE 1 is a block diagram showing the basic concept of this invention;

Figure 7:
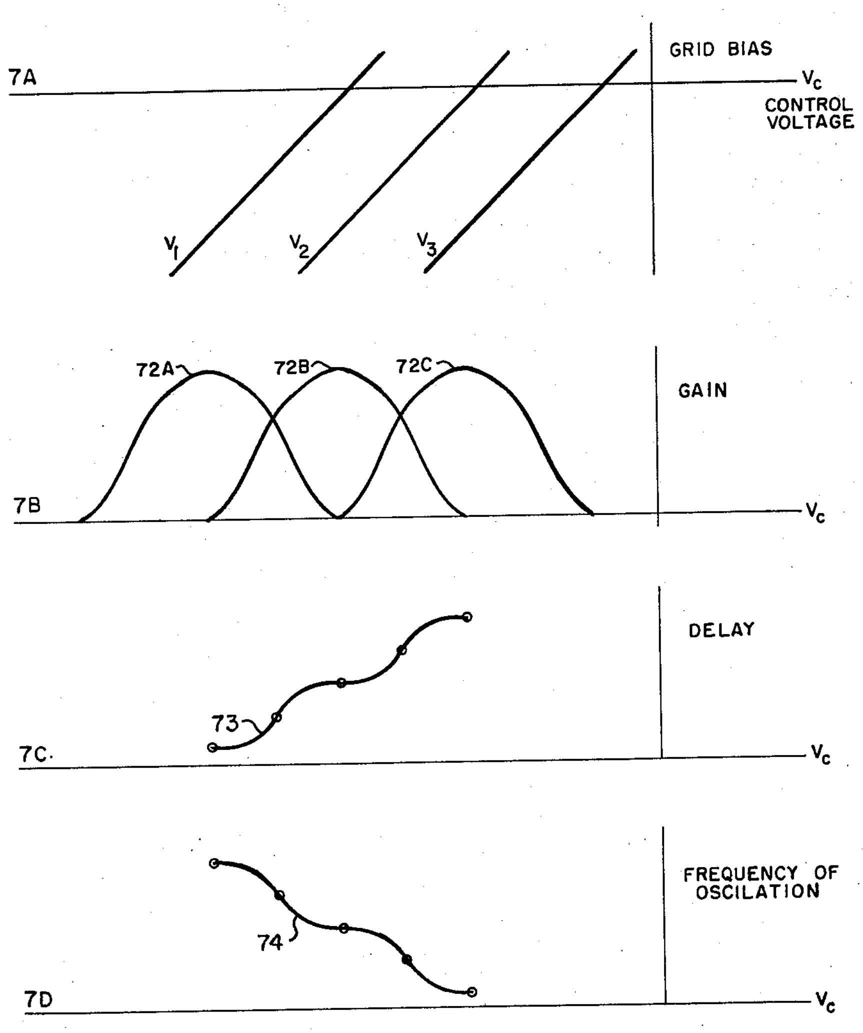
Figure 8:
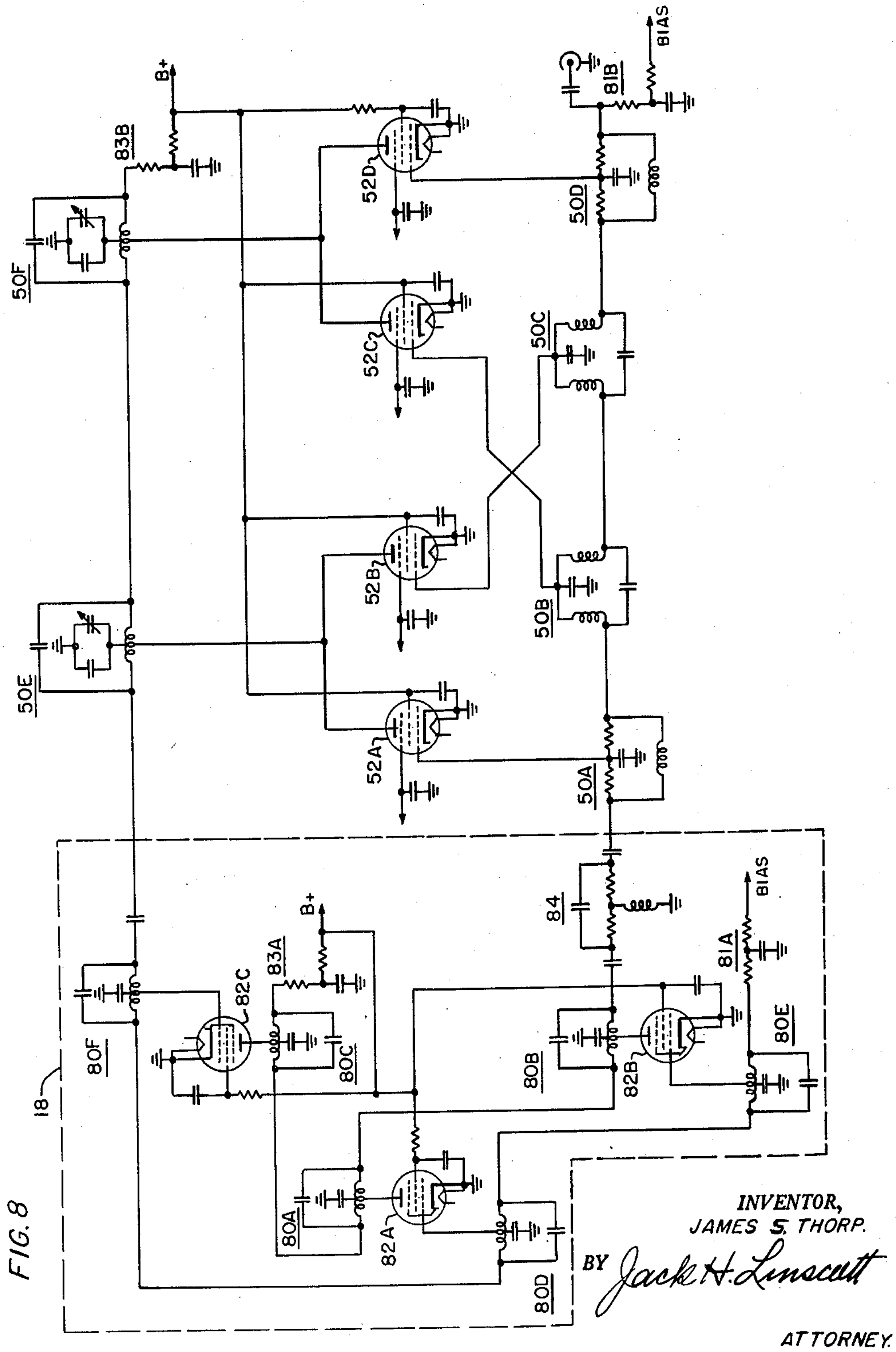

FIGURES 4, 5, and 6 are block diagrams showing some of the modifications of the basic concept;

FIGURE 7 includes graphs showing the relationship of the applied control voltage to the functions of the various elements of this invention, and FIGURE 8 is a circuit diagram of a preferred embodiment of this invention.

Figure 1:
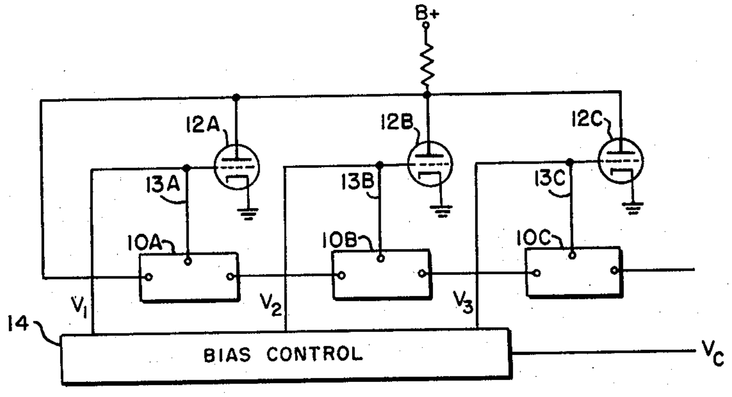

Referring now more particularly to FIGURE 1. The delay lines 10A, 10B, and 10C are connected in series. Each of the tubes 12A, 12B, and 12C has a grid connected to a corresponding one of the delay lines and a plate connected, through a common plate impedance, back to the input of the series of delay lines. The grids are biased in a common bias control 14. The cathodes are connected to ground potential.

Figure 2:
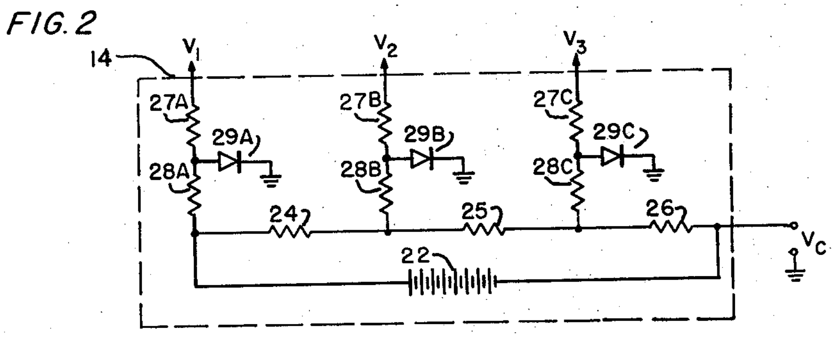
FIGURE 2 is a circuit diagram of a typical means for producing the difference in the variable voltages necessary to control the gain of the tubes.

The common bias control 14 may be of the type shown in FIGURE 2, with a common source of fixed bias voltage 22 connected across the series-connected, voltage-dividing resistors 24, 25, and 26. Isolating resistors 28A, 28B, and 28C are connected to the junctions of the voltage dividing resistors. These resistors can be connected directly to the appropriate grids when the total voltage variation is within the rated value of the tube electrodes. However, when the grid voltage swing may exceed safe limits, the voltage clamping diodes 29A, 29B, and 29C, and the additional isolating resistors 27A, 27B, and 27C, are included between the appropriate electrodes and the isolating resistors 28A, 28B, and 28C. The variable control voltage $V_c$ is applied between a given point in the bias system and ground. In other words, the bias on the grid of each of the successive tubes is the sum of the variable control bias and its own fixed bias.

Figure 3:
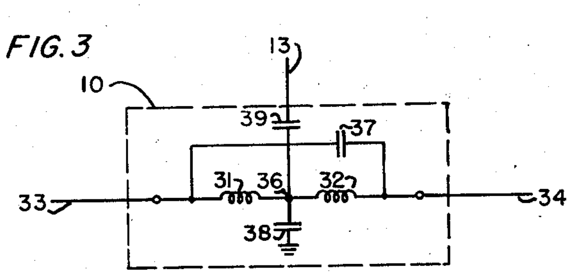
FIGURE 3 is a circuit diagram of a typical delay line that may be used in this invention.

The delay lines 10A, 10B, and 10C of FIGURE 1 may be of the type shown in FIGURE 3 which has inductances 31 and 32 in series with the line across the terminals 33 and 34, with tapping point 36 at the junction of the two inductances. A condenser 38 is connected between this junction and ground and another condenser 37 may be connected across the terminals 33 and 34. A condenser 39 must be connected between the junction 36 and the appropriate grid connection 13 because of the difference in the grid bias voltages.

It is understood that additional delay lines and tubes, of similar configuration and connection, may be added to the circuit along with additional voltage-dividing and isolating resistors to provide the correct grid bias.

It is also understood that other systems for biasing, or for control of the gain of an amplifier, may be used and that other types of delay lines, or a continuous delay line, discretely tapped, may be used in the circuit.

FIGURE 4 shows a block diagram of an oscillator, similar to that in FIGURE 1, with the additional delay lines 16A, 16B, and 16C at the outputs of the tubes 12A, 12B, and 12C to supplement the original delay lines 10A, 10B, and 10C. This will have the obvious effect of increasing the delay added by each of the tubes and may provide an improved circuit configuration under certain conditions.

In FIGURE 4, and in the other figures, the elements similar to those of FIGURE 1, and having the same function, are given the same numbers. The bias control 14 again provides the separate biases for each of the tubes.

FIGURE 4 also includes an additional amplifier 18 to supplement the gain of the tubes 12. This may be necessary where the circuit constants, the types of tubes, or the frequencies involved make the gain available in the tubes 12 less than unity.

FIGURE 5 shows a block diagram of another variation of the basic invention wherein additional increments of delay and additional control tubes are provided. In this case the delay lines may be of different lengths and the interconnection of the lines, by means of the control tubes, may be arranged to take advantage of the smaller increments. The bias control 14 is the same as in the earlier figures although it must have additional voltage-biasing and isolating resistors to accommodate the additional tubes. FIGURE 5 also shows an amplifier 18 as seen in FIGURE 4, and for the same purpose.

FIGURE 6 shows a variation of the oscillator of FIGURE 1, wherein each tube has a separate delay line and the delay lines are not connected in series. The delay lines 60A, 60B, and 60C are of successively increasing delay, and provide the same effect as the successively increasing sum of the delays associated with each of the tubes in FIGURE 1. The functions of the tubes 12A, 12B, and 12C, and of the bias control 14 are the same as in FIGURE 1.

The operation of this device will be better understood by referring to the graphs of FIGURE 7. FIGURE 7A shows the variations of the voltages $V_1$, $V_2$, and $V_3$, applied to the grids of the tubes 12A, 12B, and 12C, with respect to the voltage $V_c$ applied to the bias control 14. The voltages $V_1$, $V_2$, and $V_3$ are produced by the combination of the applied control voltage $V_c$ and the appropriate fixed bias.

The variation of the grid bias voltages $V_1$, $V_2$, and $V_3$ changes the gain of the tubes with respect to the control voltage $V_c$ in the manner shown in the graph of FIGURE 7B. Since each grid, successively, passes through its condition of optimum gain, each of the tubes will vary in gain in accordance with one of the curves 72A, 72B, or 72C. These curves must overlap in a manner somewhat similar to that shown in order to provide a smooth transition between tubes and relatively smooth change in the effective length of the delay.

In operation, any one of the tubes will provide the specific delay of the associated delay line or lines, and if its gain is greater than unity, the circuit will oscillate at a single frequency corresponding to that specific delay. However, if the delay of two successive lines of slightly differing lengths are added by adjacent tubes, the effective delay will be somewhere between the values of the individual delay paths. The effective delay will, in fact, vary from that of one of the paths to that of the other path, if the gain of the corresponding one of the tubes is decreased, while the gain of the other tube is increased, between maximum and zero.

This is seen in the curve 73 of FIGURE 7C which shows the variation in the total effective delay of the delay lines as the successive tubes are actuated by the changing control voltage $V_c$. In the case used for illustration here, the change in the effective delay is not as linear as it could be since the spacing betwen the increments of delay, and the degree of overlap of the gain of the tubes, is not as close as it can be. It is obvious that smaller increments of delay line length and longer overlap of the gains of the tubes will provide a more linear change in delay and in frequency over a corresponding change in control voltage.

The linearity of the change in effective delay with respect to the change in control voltage is also a function of the shape of the curves of FIGURE 7B, and this can be controlled to some extent by changing the shape of the curves of FIGURE 7A. Any of the well known means for controlling the shape of a characteristic curve would be applicable here.

The ultimate change in the frequency of the oscillator with respect to the change in the control voltage is seen in the curve 74 of FIGURE 7D. The relationship is only shown for the control voltage applied to three successive increments of delay line. It is obvious, as noted earlier, that the additional units can be incorporated in the circuit, and therefore that additional change in the frequency variation can be obtained with additional change in the control voltage without discontinuity in the frequency sweep.

It should be noted that while many types of tubes or amplifying means, that are well known in the art, can be used in this type of circuit, it will always be necessary that the overall gain of the circuit be greater than unity.

Also, while many types of delay lines, that are well known in the art, can be used in this type of circuit, it should be noted that the maximum difference in delay between any two successive increments must always produce a phase shift less than 180 degrees to avoid a discontinuity in the change in frequency with respect to control voltage.

Although the control of the gain of the tubes in the diagrams shown in FIGURES 1, 4, 5, and 6 is by the common means of changing the bias of the control grid, there are other equally well known ways of controlling the gain of a tube. For example, the gain of a tube may be controlled by varying the voltage applied to the screen or supressor grids. This can be done by a voltage control, similar to that shown in FIGURE 2, covering suitable ranges of voltage. Sufficient voltage variation must be available, in any case, to vary the gain of the tube from a minimum to a maximum and back to a minimum value.

Since this invention is of an electronically-controlled, voltage-variable means for changing the frequency of an oscillator, it is obvious that the oscillator is capable of being frequency modulated and that such modulation can be extended over an unusually wide band of frequencies.

FIGURE 8 shows a circuit diagram of a typical embodiment of this invention, of the general type shown in the block diagram of FIGURE 5. However, in the circuit of FIGURE 8, the gain of each tube is controlled by a variation of the potential of the suppressor grid. The elements of the circuit of FIGURE 8 that correspond to the elements of the diagram of FIGURE 5 are given the same identifying numbers. The other circuit elements of FIGURE 8 provide amplifying and other normal circuit functions. Power supply voltages are also normal and are as indicated.

In FIGURE 8 the tubes 52A through D are 6AS6 types and the tubes 82A through C are 6AK5 types. The delay lines 50A and 50D have a .8 microhenry choke across two 283 ohm resistors in series with a 10 micro-microfarad condenser between the mid-point and ground. The delay lines 50B and 50C have a 1.25 micro-microfarad condenser across two .3 microhenry chokes in series with a 10 micro-microfarad condenser between the mid-point and ground. The delay line 50E has a 5 micro-microfarad condenser across two .8 microhenry chokes in series with a 20 micro-microfarad condenser between the mid-point and ground. The delay line 50F has a 6.25 micro-microfarad condenser across two 1 microhenry chokes in series with a 25 micro-microfarad condenser between the mid-point and ground. The delay lines 80A through F have a 2.5 micro-microfarad condenser across two .4 microhenry chokes in series with a 10 micro-microfarad condenser between the mid-point and ground.

The bias filter 81A and 81B have 100,000 and 283 ohm resistors in series with a .01 microfarad condenser between their junction and ground. The power supply filters 83A and B have 510 ohm and 220 ohm resistors, respectively, in series with a 283 ohm resistor and .01 microfarad condensers between their junctions and ground. The network 84 has a .02 microfarad and a 35 micro-microfarad condenser in series with the latter across two 283 ohm resistors in series with a 2.8 microhenry choke between the mid-point and ground.

The voltage applied to 83A and B is 140 volts, the bias at 81A is −2 volts, and the bias at 81B is −1 volt; all with respect to ground. The cathode heaters have a conventional 6 volt supply, which is not shown.

The variable oscillator of FIGURE 8 will cover the frequency range between 20 and 40 megacycles, with a control voltage variation of 60 volts.

What is claimed is:

1. An oscillator comprising a plurality of amplifiers; means for increasing and decreasing the gain of each of said amplifiers in succession; a common input terminal connected to the outputs of said amplifiers; and a plurality of delay lines, each one connected between said common input terminal and the input of one of said amplifiers, said delay line for each successive amplifier having a longer time delay.

2. An externally-controllable, variable-frequency oscillator comprising at least two delay lines connected in series and having a single input; at least two amplifiers; each of said amplifiers having an input connected to a respective one of said delay lines and an output connected to said single input; means for simultaneously decreasing the gain of said first amplifier from maximum to minimum while increasing the gain of said second amplifier from minimum to maximum.

3. An oscillator comprising a plurality of delay lines having a common input; a plurality of variable gain amplifiers; each of said delay lines respectively connected to the input of one of said amplifiers, the amount of delay associated with each of said amplifiers being greater for each successive amplifier; the outputs of all of said amplifiers connected back to said common input; and means for increasing and decreasing the gain of each of said amplifiers in succession to continuously change the effective length of said delay and the frequency of said oscillator.

4. In an oscillator having its positive feedback through a delay line, means for varying the length of said delay line and providing amplification to overcome the losses in the delay line comprising a plurality of taps at intervals of increasing delay along said delay line; a plurality of amplifiers, each amplifier having an input connected to one of said taps, an output connected to the input of said delay line, and a gain control element; and means for increasing and decreasing the gain of each of said amplifiers in succession to continuously change the effective length of said delay line.

5. In an oscillator as in claim 4, said means for increasing and decreasing the gain of each of said amplifiers in succession comprising a plurality of sources of biasing voltages connected in series; means for connecting each successive source of biasing voltage to a gain control element of a corresponding, successive one of said amplifiers; and a source of control voltage, continuously variable with respect to ground, connected to said plurality of sources of biasing voltage to control all of said bias voltages simultaneously.

6. An oscillator comprising at least three delay lines each having an output, an input, and a control terminal; the output of a first of said delay lines connected to the input of a second of said delay lines; the output of a second of said delay lines connected to the input of a third of said delay lines; at least three vacuum tubes, each having an input and an output; the input of a first of said vacuum tubes connected to the control terminal of said first delay line; the output of said first vacuum tube connected to the input of said first delay line; the input of a second of said vacuum tubes connected to the control terminal of said second delay line; the output of said second vacuum tube connected to the input of said first delay line; the input of a third of said vacuum tubes connected to the control terminal of a third of said delay lines; the output of said third vacuum tube connected to the input of said first delay line; means for applying a separate bias voltage to the input of each successive vacuum tube; and means for applying a single, variable, control voltage to each of said bias voltages simultaneously.

7. A broad-band, variable-frequency oscillator comprising a plurality of vacuum tubes, each having an input and an output; a plurality of delay lines, each having an input and an output; the input of a first of said vacuum tubes connected to the output of a first of said delay lines; the output of said first vacuum tube connected to the input of said first delay line; the input of a second of said second delay lines connected to the output of said first delay line; the input of a second of said vacuum tubes connected to the output of said second delay line; the output of said second vacuum tube connected to the input of said first delay line; the input of a third of said delay lines connected to the output of said second delay line; the input of a third of said vacuum tubes connected to the output of said third delay line; the output of said third vacuum tube connected to the input of said first delay line; biasing means for holding each of said vacuum tube inputs at successively-different voltage levels, and means for applying a variable control voltage to all of said biasing means simultaneously.

8. A continuously variable oscillator comprising a first vacuum tube having input and output connections and a variable gain control; delay line means connected in series with said input and output connections of said first vacuum tube; a second vacuum tube having input and output connections and a variable gain control; delay line means connected between the outputs of said first and second vacuum tubes; delay line means connected between the inputs of said first and second vacuum tubes; a third vacuum tube having input and output connections and a variable gain control; delay line means connected between the outputs of said second and third vacuum tubes; delay line means connected between the inputs of said second and third vacuum tubes; and means connected to said variable gain controls for successively increasing and decreasing the gain of said first, second and third vacuum tubes, the combined gains of said tubes being greater than unity at all times.

9. An oscillator comprising a plurality of amplifiers, each having input and output connections; means for increasing and decreasing the gain of each of said amplifiers in succession; means for connecting the output connections of all of said amplifiers to a common terminal; and means for feeding back the signal from said common terminal to each of said input connections of said amplifiers, said means for feeding back the signal including delay line means, and said delay line means providing a different time delay to said input connections of each of said amplifiers.

References Cited in the file of this patent

UNITED STATES PATENTS

| | | |
|---|---|---|
| 2,346,800 | Usselman | Apr. 18, 1944 |
| 2,506,329 | Ames | May 2, 1950 |
| 2,565,490 | Fleming | Aug. 28, 1951 |
| 2,675,523 | Fisk et al. | Apr. 13, 1954 |
| 2,890,417 | Sanders | June 9, 1959 |
| 2,919,437 | Buie et al. | Dec. 29, 1959 |